United States Patent [19]

Mandelkorn

[11] 4,338,481
[45] Jul. 6, 1982

[54] VERY THIN SILICON WAFER BASE SOLAR CELL

[76] Inventor: Joseph Mandelkorn, Peretz 5, Rehovot, Israel

[21] Appl. No.: 176,709

[22] Filed: Oct. 2, 1980

[51] Int. Cl.³ .................... H01L 31/06; H01L 31/18
[52] U.S. Cl. .................................. 136/255; 29/572; 148/175; 148/190; 357/30
[58] Field of Search .................... 136/255, 256, 261; 29/572; 148/1.5, 175, 186, 188–190; 357/30

[56] References Cited

U.S. PATENT DOCUMENTS 3,460,240  8/1969  Tarneja et al. ........................ 29/572

OTHER PUBLICATIONS

R. V. D'Aiello et al., "Epitaxial Silicon Solar Cells", *Appl. Phys. Lett.*, vol. 28, pp. 231–234 (1976).

*Primary Examiner*—Aaron Weisstuch

[57] ABSTRACT

The performance and ruggedness of very thin silicon back surface field (BSF) solar cells are improved by the formation of a relatively thick, epitaxially grown, highly doped layer at the back of the cell and the formation of an arsenic doped layer at the top of the cell within the phosphorous diffused front region.

As a result of these modifications and the method used for fabricating the modified cell, highly effective barriers, which diminish mobile charge loss by recombination, are created at the front and back of the cell base. The cell, consisting of a high resistivity, high minority carrier lifetime, very thin base sandwiched between effective barriers, permits achievement of almost ideal performance and has improved radiation damage resistance.

The ruggedness of the very thin base cell is due to the addition of the relatively thick epitaxial layer in back of the base.

10 Claims, 1 Drawing Figure

VERY THIN SILICON WAFER BASE SOLAR CELL

BACKGROUND

Conventional solar cells are fabricated by diffusion of a high concentration of phosphorous atoms into a low resistivity, 1-10 ohm cm, "p" type silicon wafer, 0.010-0.020 inches thick, cut from a Czochralski grown, single crystal, silicon ingot. The process creates a shallow N+, P junction at the top of the wafer; the non-diffused body of the wafer, below the junction, is called the base. The thick base provides the physical support and ruggedness necessary for handling. Contacts to top and back surfaces and an antireflection coating applied to the top surface complete the cell.

It is well known that a very thin, high resistivity base, back surface field, BSF, cell should have greater resistance to radiation damage and higher open circuit voltages than the conventional cell. Furthermore, a high minority carrier lifetime, very thin base, BSF cell could, theoretically, have significantly higher open circuit voltages and efficiencies under concentrated sunlight than presently available high concentration cells. These advantages are not achievable, at least not to the same extent, if the cell base is formed by epitaxial deposition because the properties of epitaxially deposited silicon are inferior to those achievable for Czochralski or float-zone silicon wafers. However, a primary problem of thin cells in the past was that minority carriers readily reached the cell back contact where they recombined instantaneously. As a result, the voltage and current and, consequently, the efficiency of thin cells was reduced, the thinner the base the greater the degradation. It is common knowledge that an efficient thin base cell must include a back surface field which acts as a barrier, diminishing minority carrier movement to and recombination at the back contact. A know method for making a back surface field barrier is to diffuse a high concentration of boron or aluminum into the back surface of the base to create a P+, P junction and an electric field. Solar cells so made are called back surface field ("BSF") cells. Thus, in the fabrication of back surface field cells, high concentrations of dopant impurities must be diffused into both the back and front surfaces. Unfortunately, high concentrations of lattice defects form in thin silicon wafers during these diffusions; the thinner the wafer, the greater the resultant defect concentration. Formation of such defects also depends upon the element being diffused and its concentration in the wafer. Diffusion generated defects degrade the cell junctions and the minority carrier lifetime throughout a very thin base cell. In corroboration of the above statements, high resistivity, high minority carrier lifetime silicon, very thin (0.002-0.004 inch base) cells made by direct diffusions into the thin wafers have had lower open circuit voltages than thick base, BSF, cells made from the same high quality silicon using identical processing. Theoretically, the results should be exactly the opposite.

It is an objective of this invention to provide a method for fabrication of very thin base cells without the necessity of forming the cell base by means of epitaxial deposition, but rather by using a high quality silicon single crystal wafer to form the base. It is also an objective of this invention to provide a method for fabricating very thin base cells which reduces diffusion created degradations. It is a further objective of this invention to provide a method for fabricating more effective barriers, greatly diminishing minority carrier movement to both the back and front surfaces of very thin base cells, thereby reducing surface recombination and increasing cell voltage. An additional objective of this invention is to provide a rugged high efficiency very thin base cell.

SUMMARY OF THE INVENTION

An improved back surface field very thin base cell is provided. A thick epitaxial silicon layer is grown on one surface, the back, of a thick single crystal silicon wafer. Doping of the epitaxial layer is carried out simultaneously with the layer growth, and diffusion of dopant atoms from the epitaxial layer into the wafer surface also occurs simultaneously. The diffused region creates a strong electric field at the back of the wafer. The wafer is thinned by lapping and/or etching the surface opposite the epitaxial layer till the wafer thickness is that desired for the very thin base of the cell. A two-dopant diffusion is then made into the wafer surface to create a shallow diffused, top, P-N junction and a strong front surface electric field.

By this method, all diffusions are made into thick material although the final product is a very thin base surface field cell.

Front and back contacts and an antireflection coating complete the cell. The epitaxial layer provides physical ruggedness and isolates the back surface field from the back contact.

The method of this invention provides for fabrication of high efficiency very thin base cells from Czochralski or float-zone silicon wafers. This method also diminishes the lattice defect concentrations created in the silicon wafer by the front and back surface diffusions so that a very thin base cell can be made having a high minority carrier lifetime in the base and a high open circuit voltage. The method also provides a rugged very thin base cell.

DETAILED DESCRIPTION

Figure 1:
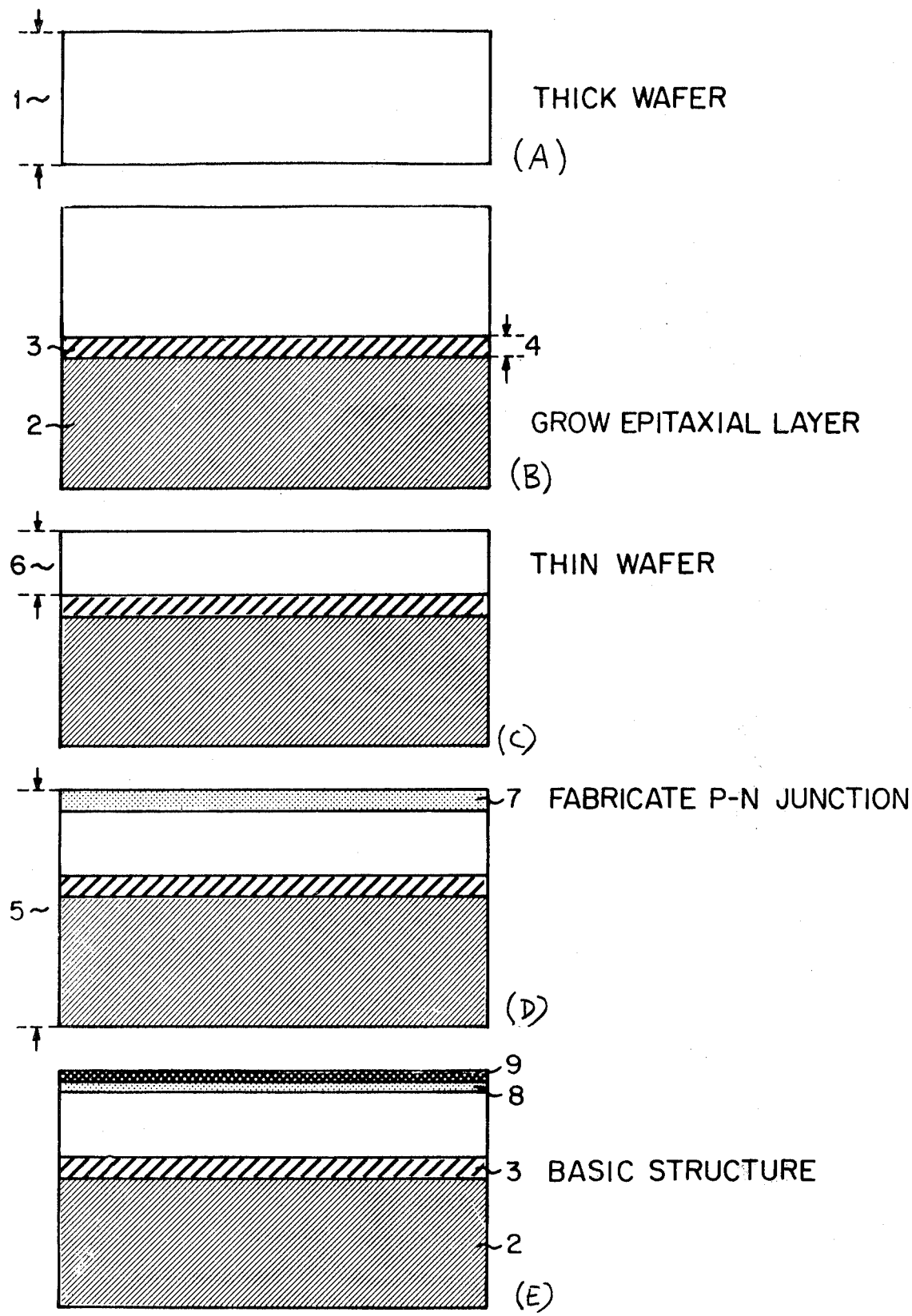

This invention comprises an improved very thin BSF silicon cell as well as a method for making such a cell. The key factors involved use of high quality silicon wafers for formation of the cell base and avoiding the condition which is part of hitherto used fabrication procedure, diffusing high concentrations of dopant impurities into the back and front surfaces of very thin silicon wafers.

As shown in FIG. 1, a thick, 0.010-0.015 inch, 1, P type wafer, constitutes the starting material for the resultant very thin base cell. In the preferred embodiment, the wafer is cut from a float-zone refined, zero dislocation density, silicon ingot having a minority carrier lifetime of 100 microseconds or more and a resistivity of at least 1.0 ohm cm, high-lifetime high-resistivity silicon. Chemical vapor deposition is used to grow a boron-doped epitaxial layer, 2, on one surface, the back, of the wafer; under the conditions for growth of the layer, temperature about 1100° C., boron atoms diffuse from the epitaxial layer into the wafer, forming a P+ diffused, back, region, 3. Times, temperatures, and flow rates of gases used for the doping and epitaxial growth process are selected to yield a P+ diffused region having a depth, 4, of about 1.0 micrometer and a boron surface concentration of about $1 \times 10^{19}$ atoms/cm$^3$. The epitaxial layer thickness is not critical. It should provide a total finished cell thickness of about 0.008 inch, 5. Following epitaxial deposition, the starting wafer is reduced in thickness to the thickness desired for the base of the cell, typically 0.0005–0.004 inches, 6,. This may be carried out by precision lapping, chemical etching, or a combination of both. The resulting surface is prepared for diffusion, and a simultaneous arsenic and phosphorus diffusion is carried out. The dopant source can be a solid source of the dopants applied to the top surface or a combination of phosphine and arsine gases. Phosphorus diffuses much faster into silicon than does arsenic. Diffusion conditions, composition of gases or of the solid source of dopants, temperature, and time, are selected to result in an N+ diffused layer, 7, consisting of an about 0.5 micrometer thick phosphorus diffused region, 8, and a corresponding about 0.2 micrometer thick arsenic diffused region, 9. The phosphorus surface concentration is restricted to about $10^{19}$ atoms/cm$^3$ whereas the arsenic surface concentration is about $10^{20}$ atoms/cm$^3$. Contacts and an antireflection coating, applied by conventional processing, complete the cell.

The primary considerations governing the design and fabrication method of this invention are based upon the following requirements:

(1) To use high quality silicon wafers to form the base of the cell.

(2) To reduce the number of lattice defects and the minority carrier lifetime degradation resulting from multiple diffusions of high concentrations of impurities. This degradation occurs both within the diffused regions and the base and results in low open circuit voltage and current. Use of simultaneous arsenic and phosphorus diffusion is important to minimize the number of high temperature diffusion processes.

(3) To create very strong electric fields at the front and back of the base of a very thin base, high resistivity cell which will act as highly effective barriers impeding minority carrier movement to surfaces.

(4) To provide a very thin base, rugged cell. This invention fulfils the requirements through use of the fabrication method disclosed in which all diffusions are made into thick wafers although the end product is the desired very thin base cell. The invention provides means and methods of diffusion which minimize the creation of lattice defects. Specifically, impurity diffusion from an epitaxial layer is a means of reducing lattice defect creation in comparison to diffusion of equal concentrations of the same impurity into exposed surfaces.

The boron atom present in a substitutional position in the silicon lattice creates more lattice strain than the phosphorus atom; a substitutional arsenic atom causes minimum strain. Phosphorus atoms, when present in high surface concentrations, enter the silicon lattice interstitially, forming minority carrier recombination centers. This invention takes the above factors into account in the formulation of the disclosed process and structure. Boron and phosphorus surface concentrations are limited to about $1 \times 10^{19}$ atoms/cm$^3$, whereas arsenic atoms, at a very high surface concentration, provide the low sheet resistance required for the front diffused region with minimum defect generation. Phosphorus and arsenic diffusions are carried out simultaneously to minimize the number of diffusion processes.

This invention is unique in its method of reducing surface recombination at the back of a very thin base cell. The disclosed structure contains an epitaxial layer which isolates the electric field at the back of the base from the back contact. This protects the critical back surface field from being degraded by back contact application, another major problem in the fabrication of very thin base, high efficiency, back surface field cells. The epitaxial layer also provides required ruggedness.

What is claimed is:

1. An improved silicon back surface field solar cell comprising a high quality very thin silicon single crystal wafer base 0.0005 to about 0.0004 inch thick, said base containing a back surface field region of the same type, P or N, as said base, said back surface field region having a thickness of about 1 μm and a dopant surface concentration of about $10^{19}$ atoms/cm$^3$, said cell having a substantially thicker epitaxial layer of silicon, doped with an impurity concentration which will provide the desired surface impurity concentration for the diffused back surface field region, interposed between the back surface field region and the cell back contact, said interposed layer having a thickness sufficient to provide required cell ruggedness.

2. A solar cell, as claimed in claim 1, whose base is P type and which has a top shallow diffused region consisting of a phosphorus diffused layer at the top of which is an arsenic diffused layer, the arsenic surface concentration being about ten times that of the phosphorus surface concentration.

3. A cell, as claimed in claim 1, whose base is cut from a high quality silicon ingot having a resistivity of about 1.0 ohm-cm or greater.

4. A cell, as claimed in claim 1, whose base is cut from a silicon ingot having a minority carrier lifetime of 100 microseconds or greater.

5. A method for fabrication of a silicon back surface field solar cell having a very thin silicon single crystal wafer base 0.0005 to about 0.004 inch thick, comprising the steps of (a) epitaxially depositing a layer of silicon on the back surface of a comparatively thick single crystal silicon wafer, said deposited layer being doped during deposition so as to provide a required impurity and impurity surface concentration for creation of an optimum back surface field diffused region in said wafer, said diffused region being of the same semiconductor type, P or N, as said wafer and being formed in said wafer during said deposition process, said diffused region having an impurity surface concentration of about $1 \times 10^{19}$ atoms/cm$^3$ and a depth of about 1 μm, said deposited silicon layer thickness being such as to provide the ruggedness required for the completed cell, (b) thinning the resultant wafer by removing silicon from its top surface to obtain the required base thickness for the cell, (c) creating a shallow P-N junction at the top of said wafer, and (d) applying top and back contacts and a top surface antireflection coating.

6. The method, as claimed in claim 5, wherein the silicon wafer is cut from a high quality ingot having a resistivity about 1.0 ohm cm or greater.

7. The method, as claimed in claim 5, wherein the silicon wafer is cut from a high quality ingot having a minority carrier lifetime of 100 microseconds or more.

8. The method as claimed in claim 5, wherein the shallow P-N junction at the top of the cell is made by simultaneous diffusion of arsenic and phosphorus with conditions such that the arsenic surface concentration is about ten times that of the phosphorus surface concentration.

9. A method for fabrication of an improved, back surface field, very thin base, cell in which a wafer is cut from a P type, float-zone, zero dislocation density, silicon ingot having a resistivity of 1.0 ohm cm or greater, said wafer being thick in comparison to the thickness desired for the base, growing an epitaxial layer on one surface, the back, of said wafer, said epitaxial layer being doped, during its growth, with boron to a concentration of about $1 \times 10^{19}$ atoms/cm$^3$, a boron diffused layer having a thickness of about 1.0 micrometer being formed in said wafer during the growth of said epitaxial layer, thinning said wafer to the thickness desired for the base by removing silicon from the surface opposite the epitaxial layer, the front surface, diffusing an N type impurity or impurities to form a shallow N+, P junction below the front surface, applying contacts to the top and bottom of the structure so formed, and applying an antireflection coating to the top surface.

10. The method, as claimed in claim 9, in which the shallow N+, P junction is formed by simultaneous diffusion of arsenic and phosphorus into the front surface, the depth of phosphorus diffusion being about 0.5 micrometers and the corresponding depth of arsenic diffusion being about 0.2 micrometers, the phosphorus surface concentration being limited to about $1 \times 10^{19}$ atoms/cm$^3$ and the arsenic surface concentration being about $1 \times 10^{20}$ atoms/cm$^3$.

* * * * *